(12) United States Patent
Nakamura et al.

(10) Patent No.: US 12,101,894 B2
(45) Date of Patent: Sep. 24, 2024

(54) WIRING BOARD

(71) Applicant: SHINKO ELECTRIC INDUSTRIES CO., LTD., Nagano (JP)

(72) Inventors: Junichi Nakamura, Nagano (JP); Takeshi Takai, Nagano (JP); Yusuke Karasawa, Nagano (JP); Yoshihisa Kanbe, Nagano (JP); Shuhei Momose, Nagano (JP); Toshiki Shirotori, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 18/177,461

(22) Filed: Mar. 2, 2023

(65) Prior Publication Data

US 2023/0209729 A1    Jun. 29, 2023

Related U.S. Application Data

(62) Division of application No. 17/444,216, filed on Aug. 2, 2021, now Pat. No. 11,632,862.

(30) Foreign Application Priority Data

Aug. 11, 2020   (JP) ................... 2020-135813

(51) Int. Cl.
*H05K 3/46*       (2006.01)
*H05K 1/11*       (2006.01)
(52) U.S. Cl.
CPC .......... *H05K 3/4661* (2013.01); *H05K 1/115* (2013.01); *H05K 2201/0212* (2013.01); *H05K 2201/0959* (2013.01); *H05K 2201/096* (2013.01)

(58) Field of Classification Search
None
See application file for complete search history.

(56) References Cited

U.S. PATENT DOCUMENTS

| 6,740,411 B2 | 5/2004 | Kojima et al. |
| 2005/0178585 A1 | 8/2005 | Kim et al. |
| 2007/0257761 A1 | 11/2007 | Mano et al. |

(Continued)

FOREIGN PATENT DOCUMENTS

| JP | 2000-004080 | 1/2000 |
| JP | 2008-028188 | 2/2008 |

(Continued)

OTHER PUBLICATIONS

Office Action mailed on Feb. 6, 2024 issued with respect to the corresponding Japanese patent application No. 2020-128108.

(Continued)

*Primary Examiner* — Hoa C Nguyen
*Assistant Examiner* — John B Freal
(74) *Attorney, Agent, or Firm* — IPUSA, PLLC

(57) ABSTRACT

A wiring board includes a core layer having a first through hole formed therein, a magnetic resin filled inside the first through hole, a second through hole formed in the magnetic resin, and a plating film covering an inner wall surface of the second through hole. The plating film includes an electroless plating film, and an electrolytic plating film. The electroless plating film makes direct contact with an inner wall surface of the second through hole.

21 Claims, 14 Drawing Sheets

(56) References Cited

U.S. PATENT DOCUMENTS

| | | | |
|---|---|---|---|
| 2008/0107863 A1* | 5/2008 | Ikeda | H01L 21/486 |
| | | | 428/137 |
| 2009/0126983 A1 | 5/2009 | Harvey et al. | |
| 2009/0225525 A1 | 9/2009 | Mano et al. | |
| 2009/0294161 A1 | 12/2009 | Yoshimura et al. | |
| 2010/0117779 A1 | 5/2010 | Mano et al. | |
| 2014/0318834 A1 | 10/2014 | Tsuchida | |
| 2015/0213946 A1 | 7/2015 | Mano et al. | |
| 2017/0250141 A1 | 8/2017 | Imayoshi | |
| 2019/0274217 A1 | 9/2019 | Zhang et al. | |
| 2019/0385777 A1* | 12/2019 | Kodama | H01F 17/0013 |
| 2020/0335270 A1 | 10/2020 | Kodama et al. | |
| 2022/0039260 A1 | 2/2022 | Momose | |
| 2022/0217844 A1 | 7/2022 | Shirotori | |

FOREIGN PATENT DOCUMENTS

| | | |
|---|---|---|
| JP | 2011-216519 | 10/2011 |
| JP | 2014-168007 | 9/2014 |
| JP | 2016-096262 | 5/2016 |
| JP | 2019-129278 | 8/2019 |
| JP | 2019-220504 | 12/2019 |
| JP | 2021-150435 | 9/2021 |

OTHER PUBLICATIONS

Office Action mailed on Dec. 26, 2023 issued with respect to the corresponding Japanese patent application No. 2020-135813.

Office Action mailed on Aug. 10, 2022 issued with respect to the related U.S. Appl. No. 17/443,034.

Office Action mailed on Nov. 10, 2022 issued with respect to the related U.S. Appl. No. 17/443,034.

Office Action issued on Dec. 20, 2022 with respect to the related U.S. Appl. No. 17/568,120.

Office Action mailed on May 14, 2024 issued with respect to the related Japanese Patent Application No. 2021-001672.

Office Action mailed on Jun. 4, 2024 issued with respect to the basic Japanese Patent Application No. 2020-135813.

* cited by examiner

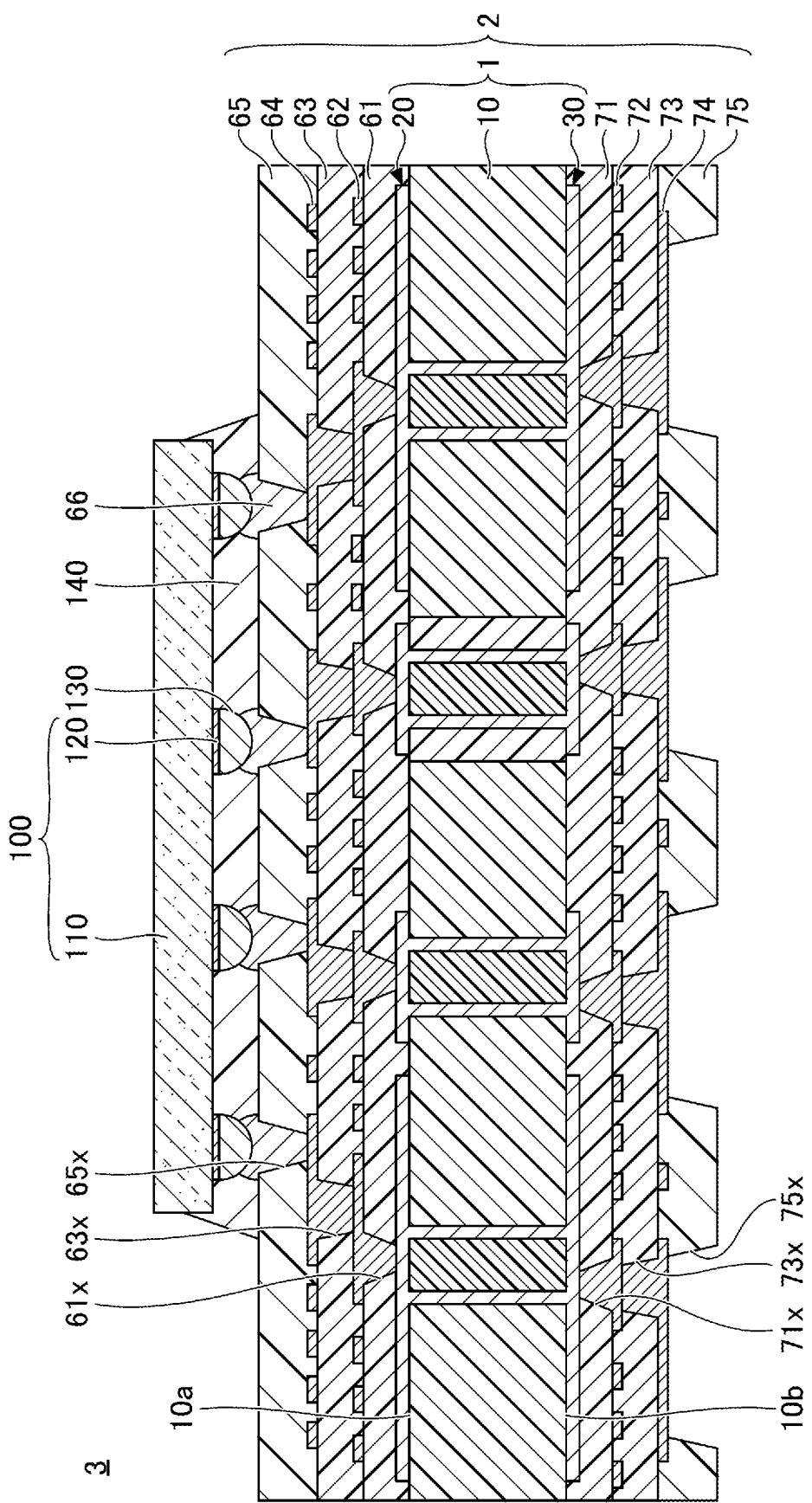

WIRING BOARD

CROSS-REFERENCE TO RELATED APPLICATIONS

This application is a divisional application of U.S. patent application Ser. No. 17/444,216 filed on Aug. 2, 2021, which is based upon and claims priority to Japanese Patent Application No. 2020-135813, filed on Aug. 11, 2020, the entire contents of which are incorporated herein by reference.

FIELD

Certain aspects of the embodiments discussed herein are related to wiring boards, and methods for manufacturing the wiring boards.

BACKGROUND

As one example of the wiring board, Japanese Laid-Open Patent Publication No. 2019-220504 proposes an inductor built-in substrate having a magnetic resin embedded inside an opening of a core substrate, and a plated film formed inside a through hole in the magnetic resin.

However, because a conductor passage from upper and lower surfaces of the magnetic resin to the inside of the through hole is long, it is difficult to directly form an electrolytic plating film on an inner wall surface of the through hole of the magnetic resin. Even if it were possible to directly form an electrolytic plating film on the inner wall surface of the through hole of the magnetic resin, the electrolytic plating film near a center along a thickness direction of the through hole would become thin, particularly in a case where the wiring board is thick. Consequently, a reliability of an interconnect formed inside the through hole becomes poor.

SUMMARY

Accordingly, it is an object in one aspect of the embodiments to provide a wiring board having a reliable interconnect inside a through hole of a magnetic resin, and a method for manufacturing the wiring boards.

According to one aspect of the embodiments, a wiring board includes a core layer having a first through hole formed therein; a magnetic resin filled inside the first through hole; a second through hole formed in the magnetic resin; and a plating film covering an inner wall surface of the second through hole, wherein the plating film includes an electroless plating film, and an electrolytic plating film, and wherein the electroless plating film makes direct contact with an inner wall surface of the second through hole.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

BRIEF DESCRIPTION OF DRAWINGS

FIG. 14 is a cross sectional view illustrating an example of a semiconductor package according to a second application.

DESCRIPTION OF EMBODIMENTS

Figure 1:
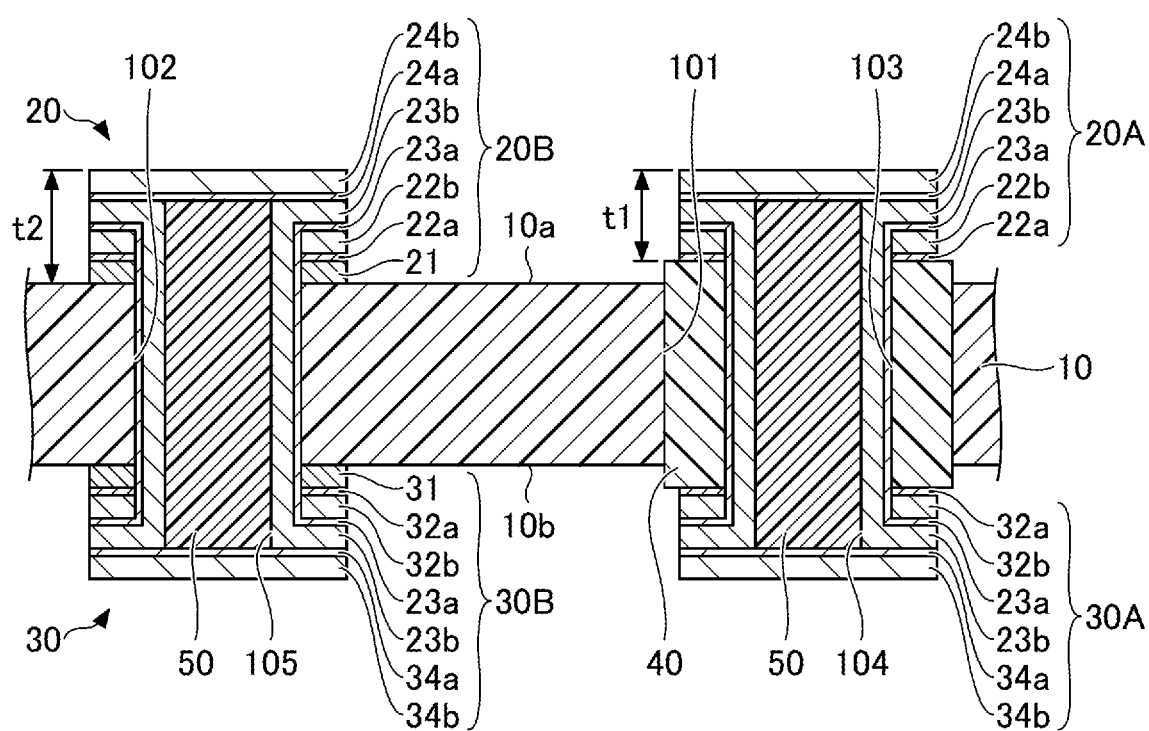
FIG. 1 is a partial cross sectional view illustrating an example of a wiring board according to a first embodiment.

Preferred embodiments of the present invention will be described with reference to the accompanying drawings. In the drawings, those constituent elements having substantially the same functions or structures are designated by the same reference numerals, and a repeated description of such constituent elements may be omitted.

A description will now be given of a wiring board according to each embodiment, and a method for manufacturing the wiring board according to each embodiment, by referring to the drawings.

First Embodiment

[Wiring Substrate Structure]

FIG. 1 is a partial cross sectional view illustrating an example of the wiring board according to a first embodiment. As illustrated in FIG. 1, a wiring board 1 includes a core layer 10, an interconnect layer 20, an interconnect layer 30, a magnetic resin 40, and an insulating resin 50.

In this embodiment, it is assumed for the sake of convenience that the side of the wiring board 1 closer to the interconnect layer 20 is an upper side or one side, and that the side of the wiring board 1 closer to the interconnect layer 30 is a lower side or the other side. In addition, it is assumed for the sake of convenience that a surface of each part closer to the interconnect layer 20 is an upper surface or one surface, and that a surface of each part closer to the interconnect layer 30 is a lower surface or the other surface. However, the wiring board 1 may be used in an upside-down state, or may be disposed at an arbitrary angle. A plan view of an object refers to a view of the object from a normal direction to one surface 10a of the core layer 10, and a planar shape of the object refers to a shape of the object in the plan view.

For example, a so-called glass epoxy substrate, which is glass cloth impregnated with an insulating resin, such as an epoxy-based resin, a polyimide-based resin, or the like, may be used for the core layer 10. A substrate, which is unwoven or woven fabric, such as glass fiber, carbon fiber, aramid fiber, or the like, impregnated with an epoxy-based resin or the like, may also be used for the core layer 10. The core layer 10 may have a thickness in a range of approximately 400 μm to approximately 1200 μm, for example.

The core layer 10 is provided with through holes 101 and 102 which penetrate the core layer 10 in a thickness direction of the core layer 10. For example, a planar shape of the through holes 101 and 102 may be circular. If the planar shape of the through hole 101 is circular, the through hole 101 may have a diameter in a range of approximately 350 μm to approximately 450 μm, for example. If the planar shape of the through hole 102 is circular, the through hole 102 may have a diameter in a range of approximately 100 μm to approximately 180 μm, for example.

The through hole 101 is filled with the magnetic resin 40. The magnetic resin 40 and a via interconnect (a second electroless plating film 23a and a second electrolytic plating film 23b, which will be described later) may form an inductor. The magnetic resin 40 may be an epoxy-based resin including magnetic particles, for example. Examples of magnetic particles include fillers such as iron, iron oxide, iron cobalt oxide, ferrosilicon, magnetic alloys, ferrites, or the like, for example.

A through hole 103 is formed near a center of the magnetic resin 40. For example, a planar shape of the through hole 103 may be circular. If the planar shapes of the through hole 101 and the through hole 103 are circular, both the through hole 101 and the through hole 103 are provided concentrically, for example. If the planar shape of the through hole 103 is circular, the through hole 103 may have a diameter in a range of approximately 100 μm to approximately 180 μm, for example.

An upper end of the magnetic resin 40 protrudes from a first surface 10a of the core layer 10, and a lower end of the magnetic resin 40 protrudes from a second surface 10b of the core layer 10. A protruding amount of the upper end of the magnetic resin 40 from the first surface 10a of the core layer 10 is approximately the same as a thickness of a metal film 21 which will be described later. A protruding amount of the lower end of the magnetic resin 40 from the second surface 10b of the core layer 10 is approximately the same as a thickness of a metal film 31 which will be described later.

The interconnect layer 20 includes at least pads 20A and 20B, and may also include an interconnect pattern. At least a part of the pad 20A is formed on one end surface of the magnetic resin 40. A planar shape of the pad 20A may be circular, for example, with a diameter larger than the diameter of the through hole 103 and smaller that the diameter of the through hole 101. At least a part of the pad 20B is formed on the first surface 10a of the core layer 10. A planar shape of the pad 20B may be circular, for example, with a diameter larger than the diameter of the through hole 102.

The interconnect layer 30 includes at least pads 30A and 30B, and may also include an interconnect pattern. At least a part of the pad 30A is formed on the other end surface of the magnetic resin 40. A planar shape of the pad 30A may be circular, for example, with a diameter larger the diameter of the through hole 103 and smaller than the diameter of the through hole 101. A part of the pad 30B is formed on the second surface 10b of the core layer 10. A planar shape of the pad 30B may be circular, for example, with a diameter larger than the diameter of the through hole 102.

The pad 20A includes a laminated part on one end surface of the magnetic resin 40. A first electroless plating film 22a, a first electrolytic plating film 22b, a second electroless plating film 23a, a second electrolytic plating film 23b, a third electroless plating film 24a, and a third electrolytic plating film 24b are successively laminated in the laminated part of the pad 20A. The first electroless plating film 22a, the first electrolytic plating film 22b, the second electroless plating film 23a, and the second electrolytic plating film 23b forming the laminated part of the pad 20A are formed to have a planar shape that is annular, for example. The third electroless plating film 24a, and the third electrolytic plating film 24b are formed to have a planar shape that is circular, for example.

The pad 30A includes a laminated part on the other end surface of the magnetic resin 40. A first electroless plating film 32a, a first electrolytic plating film 32b, a second electroless plating film 23a, a second electrolytic plating film 23b, a third electroless plating film 34a, and a third electrolytic plating film 34b are successively laminated in the laminated part of the pad 30A. The first electroless plating film 32a, the first electrolytic plating film 32b, the second electroless plating film 23a, and the second electrolytic plating film 23b forming the laminated part of the pad 30A are formed to have a planar shape that is annular, for example. The third electroless plating film 34a, and the third electrolytic plating film 34b are formed to have a planar shape that is circular, for example.

The second electroless plating film 23a, forming the laminated part of the pad 20A, is bent toward the through hole 103, and successively covers an end surface (inner wall surface) of the first electrolytic plating film 22b, and an end surface (inner wall surface) of the first electroless plating film 22a, to extend inside the through hole 103. In addition, the second electrolytic plating film 23b forming the laminated part of the pad 20A is bent toward the through hole 103 in a state where the second electrolytic plating film 23b covers the second electroless plating film 23a, to extend inside the through hole 103.

The second electroless plating film 23a inside the through hole 103 further extends to cover an end surface (inner wall surface) of the first electroless plating film 32a, and an end surface (inner wall surface) of the first electrolytic plating film 32b. The second electrolytic plating film 23b inside the through hole 103 extends further in a state where the second electrolytic plating film 23b covers the second electroless plating film 23a. Thereafter, the second electroless plating film 23a and the second electrolytic plating film 23b are bent outside the through hole 103 in a direction parallel to the second surface 10b of the core layer 10, to reach a region (or area) on the other end surface of the magnetic resin 40 of the pad 30A. That is, the pad 20A is electrically connected to the pad 30A via the second electroless plating film 23a and the second electrolytic plating film 23b which are via interconnects formed in the through hole 103.

In the through hole 103, the second electroless plating film 23a makes direct contact with the inner wall of the through hole 103, and the second electrolytic plating film 23b is laminated on the second electroless plating film 23a. A through hole 104, one size smaller than the through hole 103, is formed on an inner side of the second electrolytic plating film 23b, and the through hole 104 is filled with the insulating resin 50. The insulating resin 50 may be an insulating resin, such as an epoxy-based resin or the like, and including a filler such as silica or the like, for example.

One surface of the second electrolytic plating film 23b of the laminated part, and one end surface of the insulating resin 50 coincide, for example. In the pad 20A, the third electroless plating film 24a continuously covers one surface of the second electrolytic plating film 23b of the laminated part, and one end surface of the insulating resin 50, and the third electrolytic plating film 24b is laminated on the third electroless plating film 24a.

The other surface of the second electrolytic plating film 23b of the laminated part, and the other end surface of the insulating resin 50 coincide, for example. In the pad 30A, the third electroless plating film 34a continuously covers the other surface of the second electrolytic plating film 23b of the laminated part, and the other end surface of the insulating resin 50, and the third electrolytic plating film 34b is laminated on the third electroless plating film 34a.

The pad 20B includes a laminated part on the first surface 10a of the core layer 10. A metal film 21, the first electroless plating film 22a, the first electrolytic plating film 22b, the second electroless plating film 23a, the second electrolytic plating film 23b, the third electroless plating film 24a, and the third electrolytic plating film 24b are successively laminated in the laminated part of the pad 20B. The metal film 21, the first electroless plating film 22a, the first electrolytic plating film 22b, the second electroless plating film 23a, and the second electrolytic plating film 23b forming the laminated part of the pad 20B are formed to have a planar shape that is annular, for example. The third electroless plating film 24a, and the third electrolytic plating film 24b are formed to have a planar shape that is circular, for example.

The pad 30B includes a laminated part on the second surface 10b of the core layer 10. The metal film 31, the first electroless plating film 32a, the first electrolytic plating film 32b, the second electroless plating film 23a, the second electrolytic plating film 23b, the third electroless plating film 34a, and the third electrolytic plating film 34b are successively laminated in the laminated part of the pad 30B. The metal film 31, the first electroless plating film 32a, the first electrolytic plating film 32b, the second electroless plating film 23a, and the second electrolytic plating film 23b forming the laminated part of the pad 30B are formed to have a planar shape that is annular, for example. The third electroless plating film 34a, and the third electrolytic plating film 34b are formed to have a planar shape that is circular, for example.

The second electroless plating film 23a forming the laminated part of the pad 20B is bent toward the through hole 102, and successively covers the end surface (inner wall surface) of the first electrolytic plating film 22b, and the end surface (inner wall surface) of the first electroless plating film 22a, and the end surface (the inner wall surface) of the metal film 21, to extend inside the through hole 102. In addition, the second electrolytic plating film 23b forming the laminated part of the pad 20B is bent toward the through hole 102, in a state where the second electrolytic plating film 23b covers the second electroless plating film 23a, to extend inside the through hole 102.

The second electroless plating film 23a inside the through hole 102 further extends to cover an end surface (inner wall surface) of the metal film 31, an end surface (inner wall surface) of the first electroless plating film 32a, and an end surface (inner wall surface) of the first electrolytic plating film 32b. The second electrolytic plating film 23b inside the through hole 102 extends further in a state where the second electrolytic plating film 23b covers the second electroless plating film 23a. Thereafter, the second electroless plating film 23a and the second electrolytic plating film 23b are bent outside the through hole 102 in a direction parallel to the second surface 10b of the core layer 10, to reach a region (or area) on the second surface 10b of the core layer 10 of the pad 30B. That is, the pad 20B is electrically connected to the pad 30B via the second electroless plating film 23a and the second electrolytic plating film 23b which are via interconnects formed in the through hole 102.

In the through hole 102, the second electroless plating film 23a makes direct contact with the inner wall surface of the through hole 102, and the second electrolytic plating film 23b is laminated on the second electroless plating film 23a. A through hole 105, one size smaller than the through hole 102, is formed on the inner side of the second electrolytic plating film 23b, and the through hole 105 is filled with the insulating resin 50.

One surface of the second electrolytic plating film 23b of the laminated part, and one end surface of the insulating resin 50 coincide, for example. In the pad 20B, the third electroless plating film 24a continuously covers one surface of the second electrolytic plating film 23b of the laminated part, and one end surface of the insulating resin 50, and the third electrolytic plating film 24b is laminated on the third electroless plating film 24a.

The other surface of the second electrolytic plating film 23b of the laminated part, and the other end surface of the insulating resin 50 coincide, for example. In the pad 30B, the third electroless plating film 34a continuously covers the other surface of the second electrolytic plating film 23b of the laminated part, and the other end surface of the insulating resin 50, and the third electrolytic plating film 34b is laminated on the third electroless plating film 34a.

The material used for the metal films 21 and 31, the first electroless plating films 22a and 32a, the first electrolytic plating films 22b and 32b, the second electroless plating film 23a, the second electrolytic plating film 23b, the third electroless plating films 24a and 34a, and the third electrolytic plating films 24b and 34b, may be copper, copper alloys, or the like, for example, and may also be other metals, such as nickel or the like.

Due to additives included in a plating solution used for the electroless plating, a plating pretreatment, or the like, the electroless plating film may include nickel (Ni), palladium (Pd), or the like, for example. A Ni-content in the electroless plating film may be 5 wt % or less, and a Pd-content in the electroless plating film may be 1 wt % or less, for example. On the other hand, the electrolytic plating film does not include the Ni, Pd, or the like included in the electroless plating film.

The metal films 21 and 31 may have thicknesses in a range of approximately 6 µm to approximately 18 µm, for example. The first electroless plating films 22a and 32a may have thicknesses in a range of approximately 0.5 µm to approximately 3 µm, for example. The first electrolytic plating films 22b and 32b may have thicknesses in a range of approximately 3 µm to approximately 14 µm, for example. Because the thicknesses of the first electrolytic plating films 22b and 32b are 3 µm or greater, it is possible to reduce peeling of the first electrolytic plating films 22b and 32b from the magnetic resin 40.

The second electroless plating film 23a may have a thickness in a range of approximately 0.5 µm to approximately 3 µm, for example. The second electrolytic plating film 23b may have a thickness in a range of approximately 2 µm to approximately 40 µm, for example. The third electroless plating films 24a and 34a may have thicknesses in a range of approximately 0.5 µm to approximately 3 µm, for example. The third electrolytic plating films 24b and 34b may have thicknesses in a range of approximately 6 µm to approximately 24 µm, for example. Because the thicknesses of the third electrolytic plating films 24b and 34b are 6 µm or greater, it is possible to reduce penetration of the third electrolytic plating films 24b and 34b by the laser when using the laser to prove a via hole (for example, via holes 61x and 71x illustrated in FIG. 13 which will be described later) in an insulating layer which forms an upper layer.

The pads 20A and 30A may have thicknesses t1, for example, and the pads 20B and 30B may have thicknesses t2, for example. The thicknesses t2 of the pads 20B and 30B are greater than the thicknesses t1 of the pads 20A and 30A by an amount corresponding to the thicknesses (for example, in a range of approximately 6 µm to approximately 18 µm) of the metal films 21 and 31.

Accordingly, by making the thicknesses t2 of the pads 20B and 30B large, it is possible to relieve stress caused by expansion of the insulating resin 50 at high temperatures, and improve the durability against the stress. That is, because the expansion of the insulating resin 50 is greater than the expansion of the core layer 10 in the thickness direction, pressure and cracks caused by a difference between the expansions of the insulating resin 50 and the core layer 10 can be reduced by making the thicknesses t2 of the pads 20B and 30B large. As a result, it is possible to prevent open-circuit defects and deterioration in the reliability of the pads 20B and 30B.

Because the difference between the expansions of the core layer 10 and the insulating resin 50, with respect to the pads 20A and 30A, can be relieved by the magnetic resin 40, the reliability of the pads 20A and 30A can be sufficiently high even if the thicknesses t1 of the pads 20A and 30A are smaller than the thicknesses t2 of the pads 20B and 30B.

Accordingly, the wiring board 1 includes the plating film covering the inner wall surface of the through hole 103 formed in the magnetic resin 40, and the plating film covering the inner wall surface of the through hole 103 includes the electroless plating film and the electrolytic plating film. Further, the electroless plating film makes direct contact with the inner wall surface of the through hole 103. More particularly, the second electroless plating film 23a and the second electrolytic plating film 23b formed inside the through hole 103 form the via interconnects, and the second electroless plating film 23a makes direct contact with the inner wall surface of the through hole 103. According to this structure, the second electroless plating film 23a can be formed on the inner wall surface of the through hole 103 with a high reliability, and the second electrolytic plating film 23b, which is relatively thick, can be formed on the second electroless plating film 23a. Further, according to this structure, even if the core layer 10 is thick, the via interconnect having a high reliability can be formed inside the through hole 103, because the second electrolytic plating film 23b near the center of the through hole 130 along the thickness direction of the through hole 103 can be formed to a sufficiently large thickness. For example, it is possible to prevent breaking of the second electrolytic plating film 23b inside the through hole 103.

The thickness of the second electrolytic plating film 23b positioned inside the through hole 103 may be greater than the thickness of the second electrolytic plating film 23b in the laminated part. For this reason, it is possible to improve the reliability of the via interconnect formed inside the through hole 103. Further, because the thickness of the laminated part can be made small, it is possible to reduce the size of the interconnect layer 20 and the interconnect layer 30. In order to improve the reliability of the via interconnect formed in the through hole 103, the thickness of the second electrolytic plating film 23b inside the through hole 103 may be made larger than the thicknesses of the first electrolytic plating films 22b and 32b, and the thicknesses of the third electrolytic plating films 24b and 34b.

[Method for Manufacturing Wiring Board]

Next, a method for manufacturing the wiring board according to the first embodiment will be described. FIG. 2A through FIG. 8 are diagrams illustrating an example of processes of manufacturing the wiring board according to the first embodiment. Although the example described hereinafter manufactures one wiring board, structures respectively corresponding to the wiring board may be formed and singulated from a large laminate, for example.

Figure 2A:
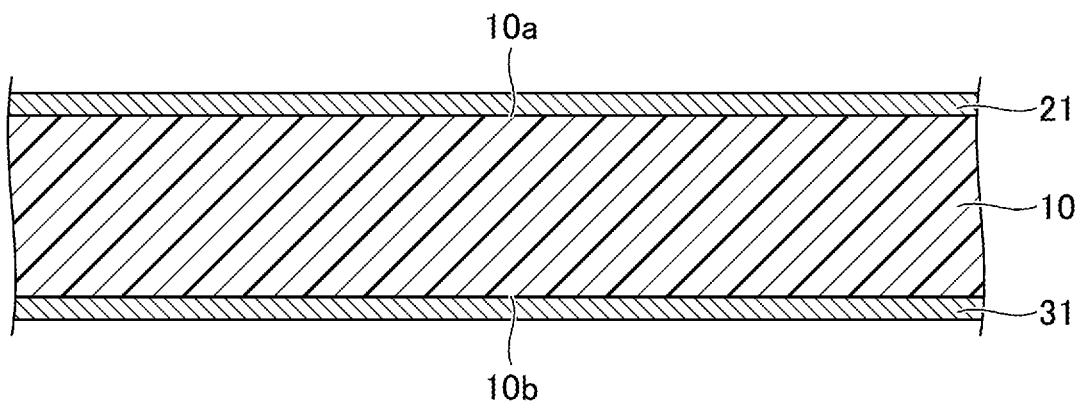
FIG. 2A and FIG. 2B are diagrams (part 1) illustrating an example of manufacturing processes of the wiring board according to the first embodiment.

First, in the process (or step) illustrated in FIG. 2A, a laminated plate is prepared by forming the metal film 21 on the first surface 10a of the core layer 10, which is a so-called glass epoxy substrate or the like, and forming the metal film 31 on the second surface 10b of the core layer 10, for example. At this point in time, the metal films 21 and 31 are planar copper foils or the like that are not yet patterned.

Figure 2B:
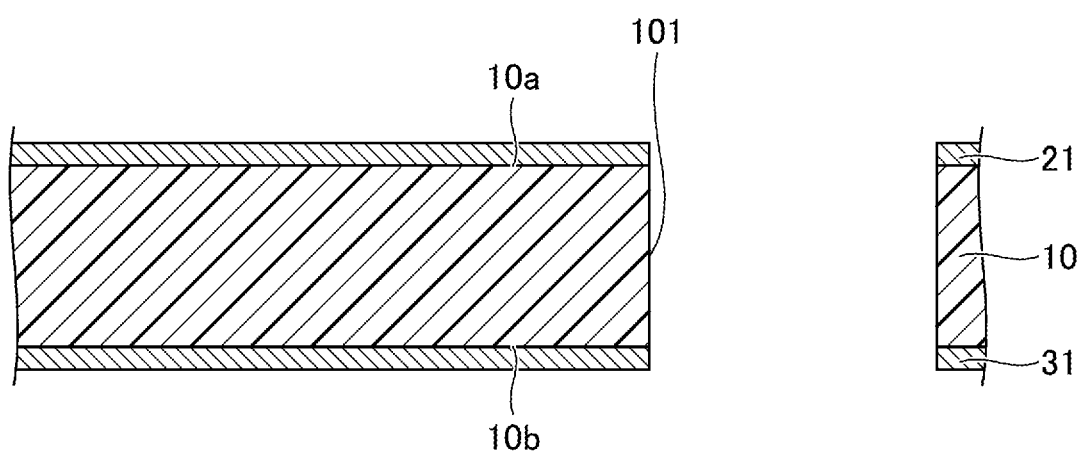

Next, in the process illustrated in FIG. 2B, the through hole 101, which penetrates the metal film 21, the core layer 10, and the metal film 31, is formed. The planar shape of the through hole 101 may be circular, for example. The through hole 101 may be formed by laser beam machining, drilling, or the like. After the through hole 101 is formed, a desmear process is performed, as required, to remove resin residue included in the core layer 10 adhered to the inner wall surface of the through hole 101. For example, the desmear process may be performed using a potassium permanganate solution.

Figure 3A:
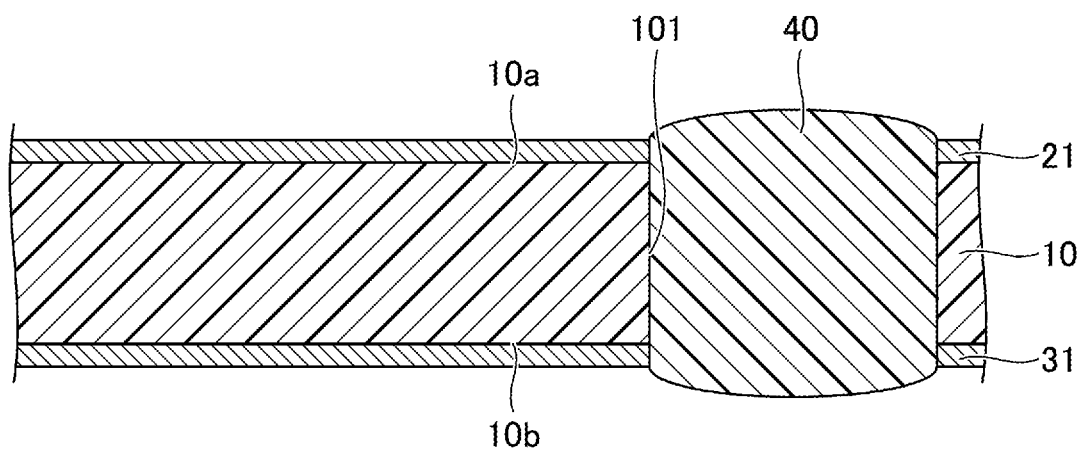
FIG. 3A and FIG. 3B are diagrams (part 2) illustrating the example of the manufacturing processes of the wiring board according to the first embodiment.

Next, in the process illustrated in FIG. 3A, the magnetic resin 40 is filled into the through hole 101. The magnetic resin 40 may be filled into the through hole 101 by screen printing or the like, for example. The magnetic resin 40 is filled to protrude from the upper surface of the metal film 21 and from the lower surface of the metal film 31. The material of the magnetic resin 40 is as described above.

Figure 3B:
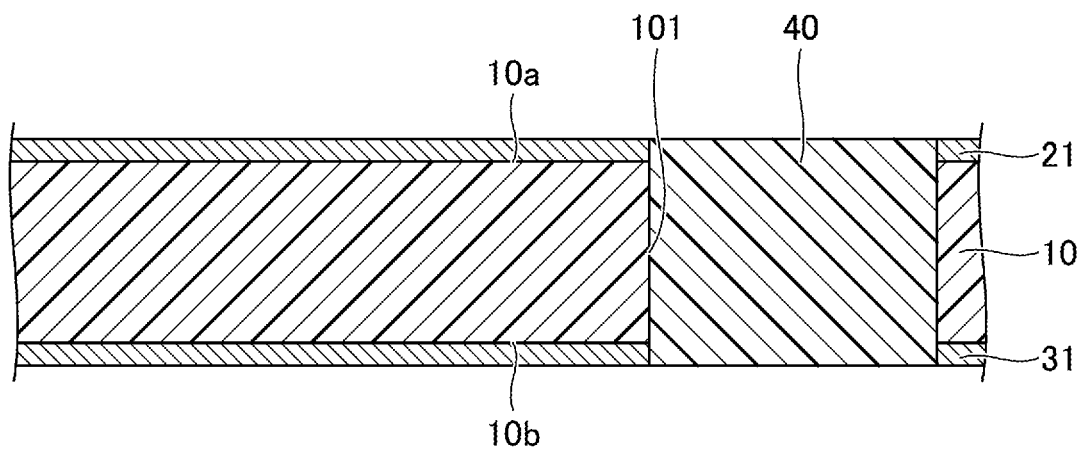

Next, in the process illustrated in FIG. 3B, the magnetic resin 40, protruding from the upper surface of the metal film 21, and from the lower surface of the metal film 31, is polished. The magnetic resin 40 may be polished by buffing, roll polishing, or the like, for example. One end surface of the magnetic resin 40 may coincide with the upper surface of the metal film 21, for example, and the other end surface of the magnetic resin 40 may coincide with the lower surface of the metal film 31, for example.

Figure 4A:
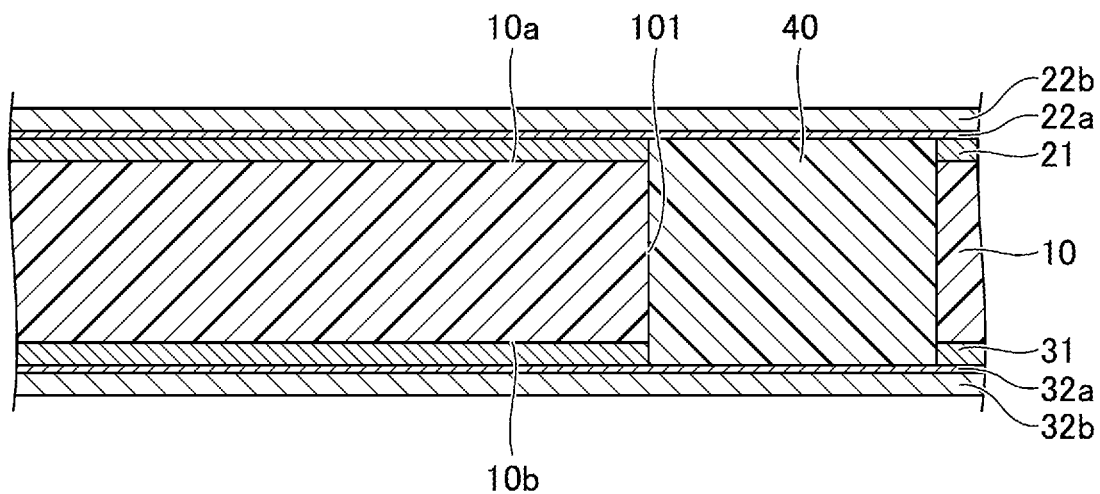
FIG. 4A and FIG. 4B are diagrams (part 3) illustrating the example of the manufacturing processes of the wiring board according to the first embodiment.

Next, in the process illustrated in FIG. 4A, the first electroless plating film 22a, which continuously covers the upper surface of the metal film 21 and one end surface of the magnetic resin 40, is formed by electroless plating. Then, the first electrolytic plating film 22b is laminated on the first electroless plating film 22a, by electrolytic plating using the first electroless plating film 22a as a plating feed layer. Similarly, the first electroless plating film 32a, which continuously covers the lower surface of the metal film 31 and the other end surface of the magnetic resin 40, is formed by electroless plating. Then, the first electrolytic plating film 32b is laminated on the first electroless plating film 32a, by electrolytic plating using the first electroless plating film 32a as a plating feed layer. The materials used for and thicknesses of the first electroless plating films 22a and 32a, and the first electrolytic plating films 22b and 32b, are as described above.

Figure 4B:
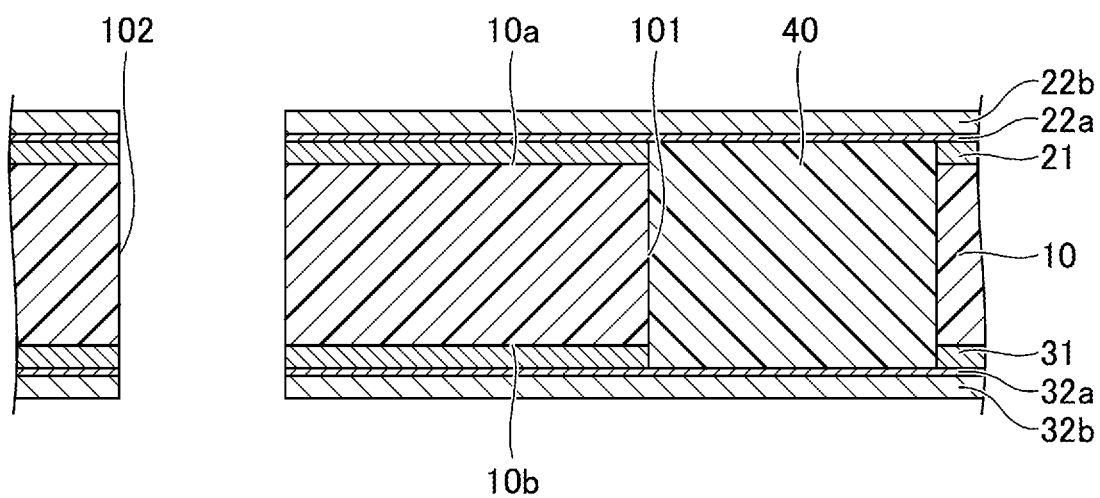

Next, in the process illustrated in FIG. 4B, the through hole 102, which penetrates the first electrolytic plating film 22b, the first electroless plating film 22a, the metal film 21, the core layer 10, the metal film 31, the first electroless plating film 32a, and the first electrolytic plating film 32b, is formed. The planar shape of the through hole 102 may be circular, for example. The through hole 102 may be formed by laser beam machining, drilling, or the like, for example. After the through hole 102 is formed, a desmear process is performed, as required, to remove the resin residue of the core layer 10 adhered to the inner wall surface of the through hole 102.

Figure 5A:
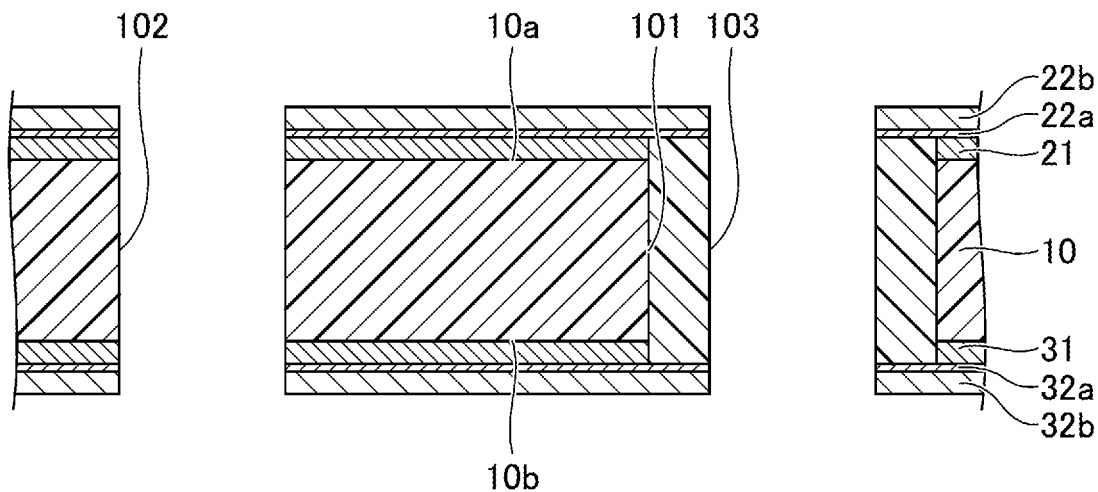
FIG. 5A and FIG. 5B are diagrams (part 4) illustrating the example of the manufacturing processes of the wiring board according to the first embodiment.

Next, in the process illustrated in FIG. 5A, a through hole 103, which penetrates the first electrolytic plating film 22b, the first electroless plating film 22a, the magnetic resin 40, the first electroless plating film 32a, and the first electrolytic plating film 32b, is formed. The planar shape of the through hole 103 may be circular, for example. The through hole 103 may be formed by laser beam machining, drilling, or the like, for example. After forming the through hole 103, a cleaning process is performed using water, to remove residue of the magnetic resin 40 adhered to the inner wall surface of the through hole 103.

Figure 5B:
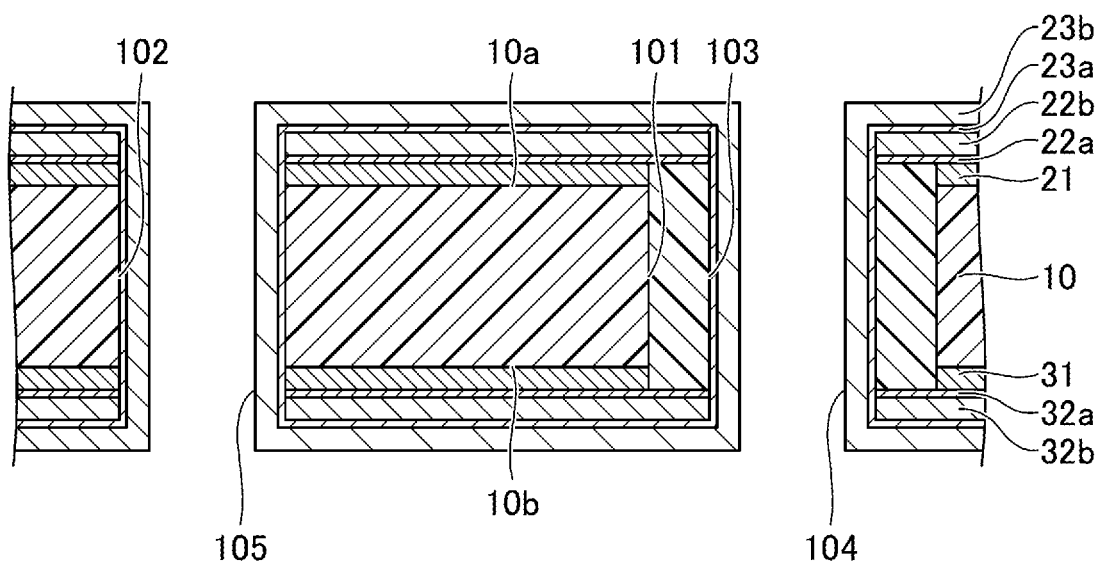

Next, in the process illustrated in FIG. 5B, the second electroless plating film 23a, covering the upper surface of the first electrolytic plating film 22b, the inner wall surfaces of the through holes 102 and 103, and the lower surface of the first electrolytic plating film 32b, is formed by electroless plating. The second electroless plating film 23a makes direct contact with the inner wall surfaces of the through holes 102 and 103. Next, the second electrolytic plating film 23b is laminated on the second electroless plating film 23a, by electrolytic plating using the second electroless plating film 23a as a plating feed layer. The materials and thicknesses of the second electroless plating film 23a and the second electrolytic plating film 23b are as described above. The through hole 104, which is one size smaller than the through hole 103, is formed on the inner side of the second electrolytic plating film 23b inside the through hole 103, and the through hole 105, which is one size smaller than the through hole 102, is formed on the inner side of the second electrolytic plating film 23b inside the through hole 102.

Figure 6A:
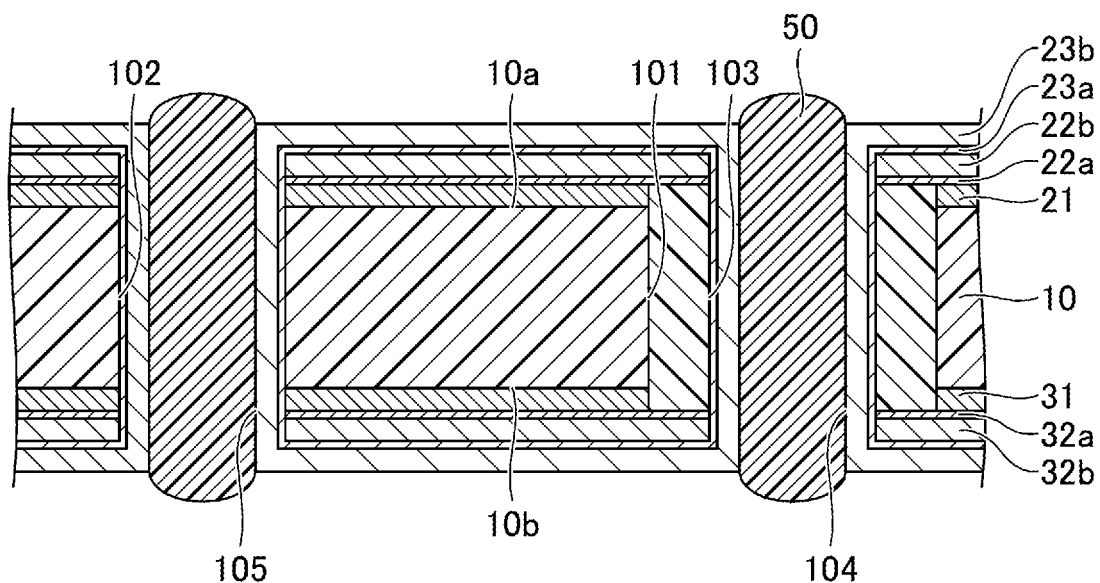
FIG. 6A and FIG. 6B are diagrams (part 5) illustrating the example of the manufacturing processes of the wiring board according to the first embodiment.

Next, in the process illustrated in FIG. 6A, the insulating resin 50 is filled into the through holes 104 and 105. The insulating resin 50 may be filled into the through holes 104 and 105 by screen printing or the like, for example. The insulating resin 50 is filled to protrude from the upper surface of the second electrolytic plating film 23b positioned closer to the first surface 10a of the core layer 10, and from the lower surface of the second electrolytic plating film 23b positioned closer to the second surface 10b of the core layer 10. The material used for the insulating resin 50 is as described above.

Figure 6B:
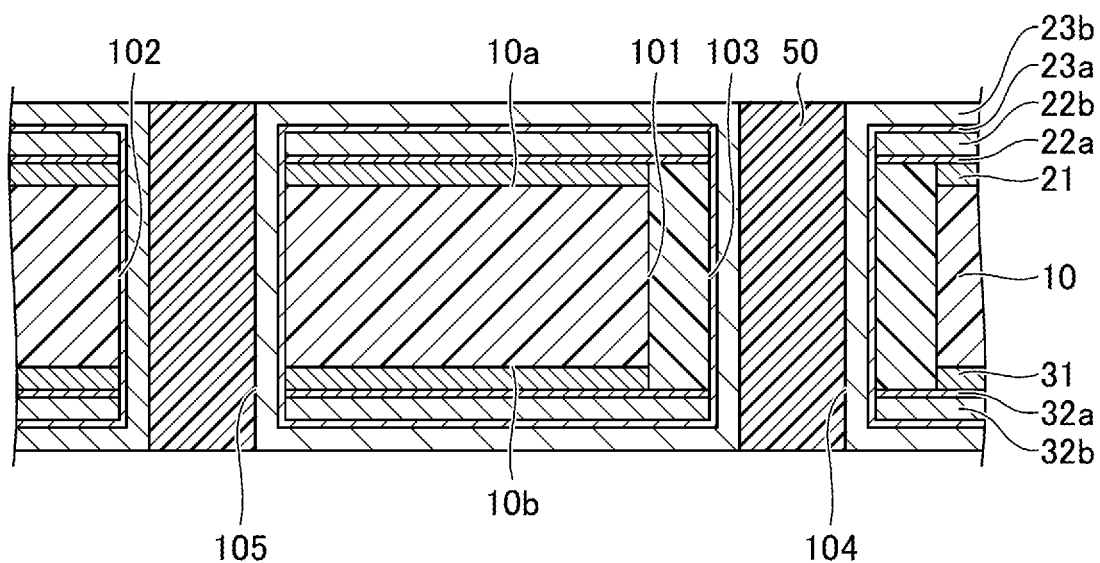

Next, in the process illustrated in FIG. 6B, the insulating resin 50 protruding from the upper surface of the second electrolytic plating film 23b positioned closer to the first surface 10a of the core layer 10, and from the lower surface of the second electrolytic plating film 23b positioned closer to the second surface 10b of the core layer 10, is polished. The insulating resin 50 may be polished by buffing, roll polishing, or the like, for example. The upper end surface of the insulating resin 50 coincides with the upper surface of the second electrolytic plating film 23b positioned closer to the first surface 10a of the core layer 10, for example, and the lower end surface of the insulating resin 50 coincides with the lower surface of the second electrolytic plating film 23b positioned closer to the second surface 10b of the core layer 10, for example. After the polishing, a desmear process is performed, as required, to remove residue of the insulating resin 50 adhered to the upper end surface of the insulating resin 50, the upper surface of the second electrolytic plating film 23b positioned closer to the first surface 10a of the core layer 10, the lower end surface of the insulating resin 50, and the lower surface of the second electrolytic plating film 23b positioned closer to the second surface 10b of the core layer 10.

Figure 7A:
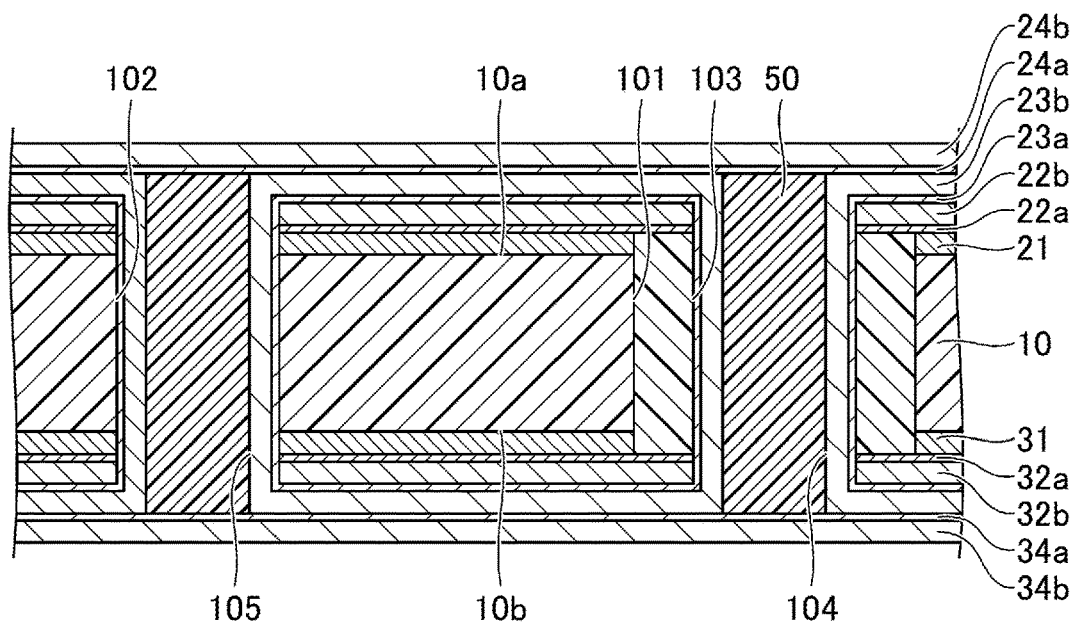
FIG. 7A and FIG. 7B are diagrams (part 6) illustrating the example of the manufacturing processes of the wiring board according to the first embodiment.

Next, in the process illustrated in FIG. 7A, the third electroless plating film 24a, which continuously covers the upper surface of the second electrolytic plating film 23b positioned closer to on the first surface 10a of the core layer 10, and the upper surface of the insulating resin 50, is formed by electroless plating. Then, the third electrolytic plating film 24b is laminated on the third electroless plating film 24a, by electrolytic plating using the third electroless plating film 24a as a plating feed layer. Similarly, the third electroless plating film 34a, which continuously covers the lower surface of the second electrolytic plating film 23b positioned closer to the second surface 10b of the core layer 10, and the lower surface of the insulating resin 50, is formed by electroless plating. Then, the third electrolytic plating film 34b is laminated on the third electroless plating film 34a, by electrolytic plating using the third electroless plating film 34a as a plating feed layer. The materials and thicknesses of the third electroless plating films 24a and 34a, and the third electrolytic plating films 24b and 34b, are as described above.

Figure 7B:
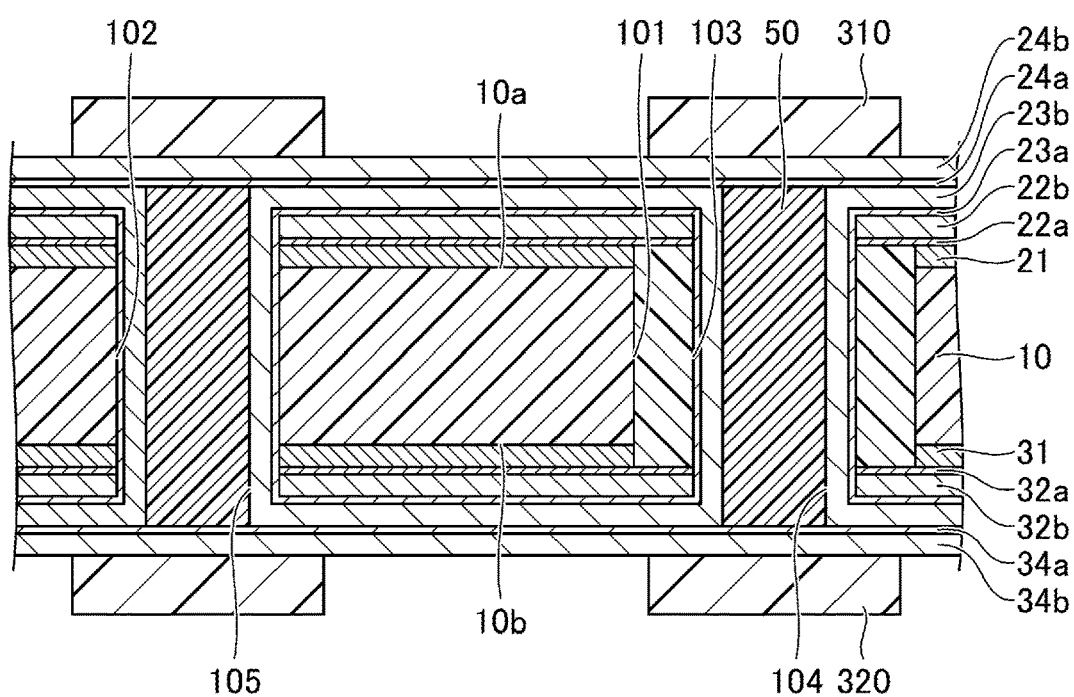

Next, in the process illustrated in FIG. 7B, an etching resist pattern 310, which covers a region (or area) where the interconnect layer 20 including the pads 20A and 20B is to be formed, is formed on upper top surface of the third electrolytic plating film 24b. In addition, an etching resist pattern 320, which covers a region (or area) where the interconnect layer 30 including the pads 30A and 30B is to be formed, is formed on the lower surface of the third electrolytic plating film 34b. The materials of the etching resist patterns 310 and 320 are not particularly limited, as long as the material has a desired resolution and etching resistance.

If the planar shape of the magnetic resin 40 is circular, the etching resist patterns 310 and 320, in the regions where the pads 20A and 30A are to be formed, have a diameter smaller than the diameter of the magnetic resin 40, and larger than the diameter of the insulating resin 50, for example, and are formed at positions at least overlapping the insulating resin 50 in the plan view. In addition, if the planar shape of the insulating resin 50 is circular, the etching resist patterns 310 and 320, in the regions where the pads 20B and 30B are to be formed, have a diameter larger the diameter of the insulating resin 50, and are formed at positions at least overlapping the insulating resin 50 in the plan view.

Figure 8:
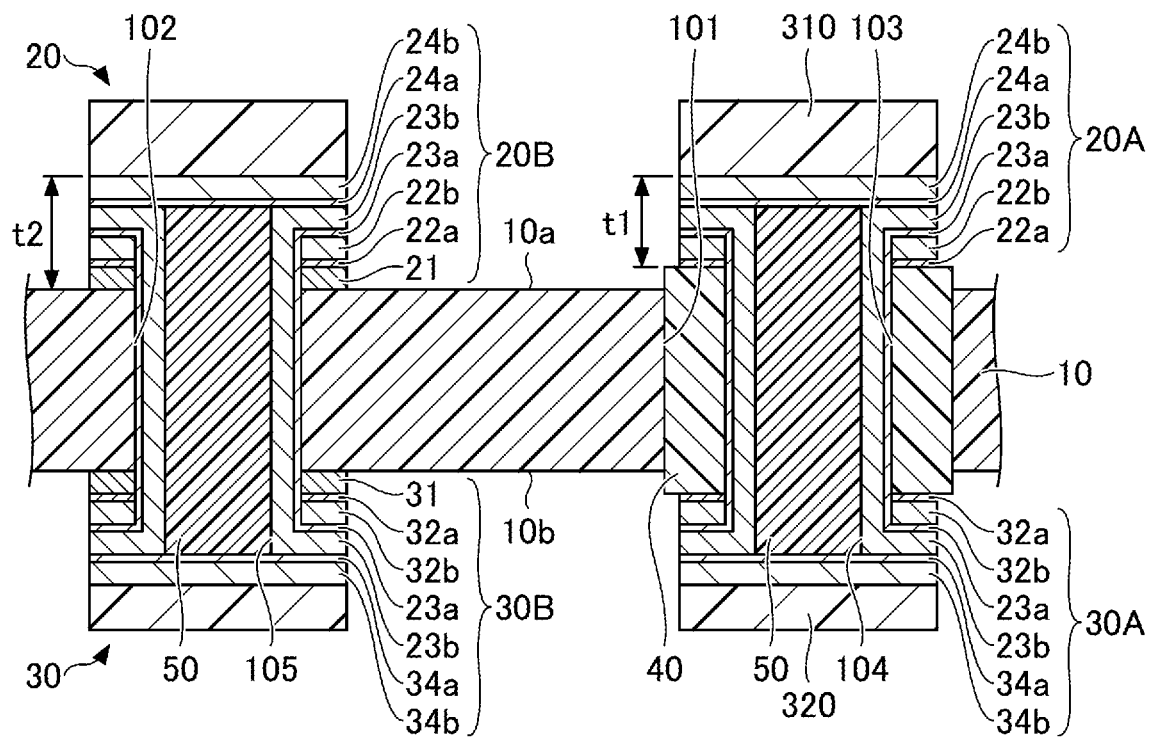
FIG. 8 is a diagram (part 7) illustrating the example of the manufacturing process of the wiring board according to the first embodiment.

Next, in the process illustrated in FIG. 8, the metal film 21, the first electroless plating film 22a, the first electrolytic plating film 22b, the second electroless plating film 23a and the second electrolytic plating film 23b positioned closer to the first surface 10a of the core layer 10, the third electroless plating film 24a, and the third electrolytic plating film 24b are removed, by wet etching using the etching resist pattern 310 as a mask. The metal film 31, the first electroless plating film 32a, the first electrolytic plating film 32b, the second electroless plating film 23a and the second electrolytic plating film 23b positioned closer to the second surface 10b of the core layer 10, the third electroless plating film 34a, and the third electrolytic plating film 34b are removed, by wet etching using the etching resist pattern 320 as a mask. As a result, the interconnect layer 20 including the pads 20A and 20B, and the interconnect layer including the pads 30A and 30B, are formed. When copper or copper alloy is used as the material of each of the electroless plating films and each of the electrolytic plating films, a ferric chloride aqueous solution or a cupric chloride aqueous solution may be used as an etchant, for example. Thereafter, the etching resist patterns 310 and 320 are removed, thereby completing the wiring board 1 illustrated in FIG. 1.

The magnetic resin 40 looses magnetic particles when exposed to an alkaline agent, such as a potassium permanganate solution or the like, thereby causing a decrease in inductance. However, in the manufacturing method according to this embodiment, the decrease in inductance can be avoided because the magnetic resin 40 is covered by the plating film before being exposed to the alkaline agent.

<First Modification of First Embodiment>

A first modification of the first embodiment illustrates an example provided with a plurality of through holes penetrating the magnetic resin. In this first modification of the first embodiment, those constituent elements having substantially the same functions or structures are designated by the same reference numerals, and a repeated description of such constituent elements may be omitted.

Figure 9A:
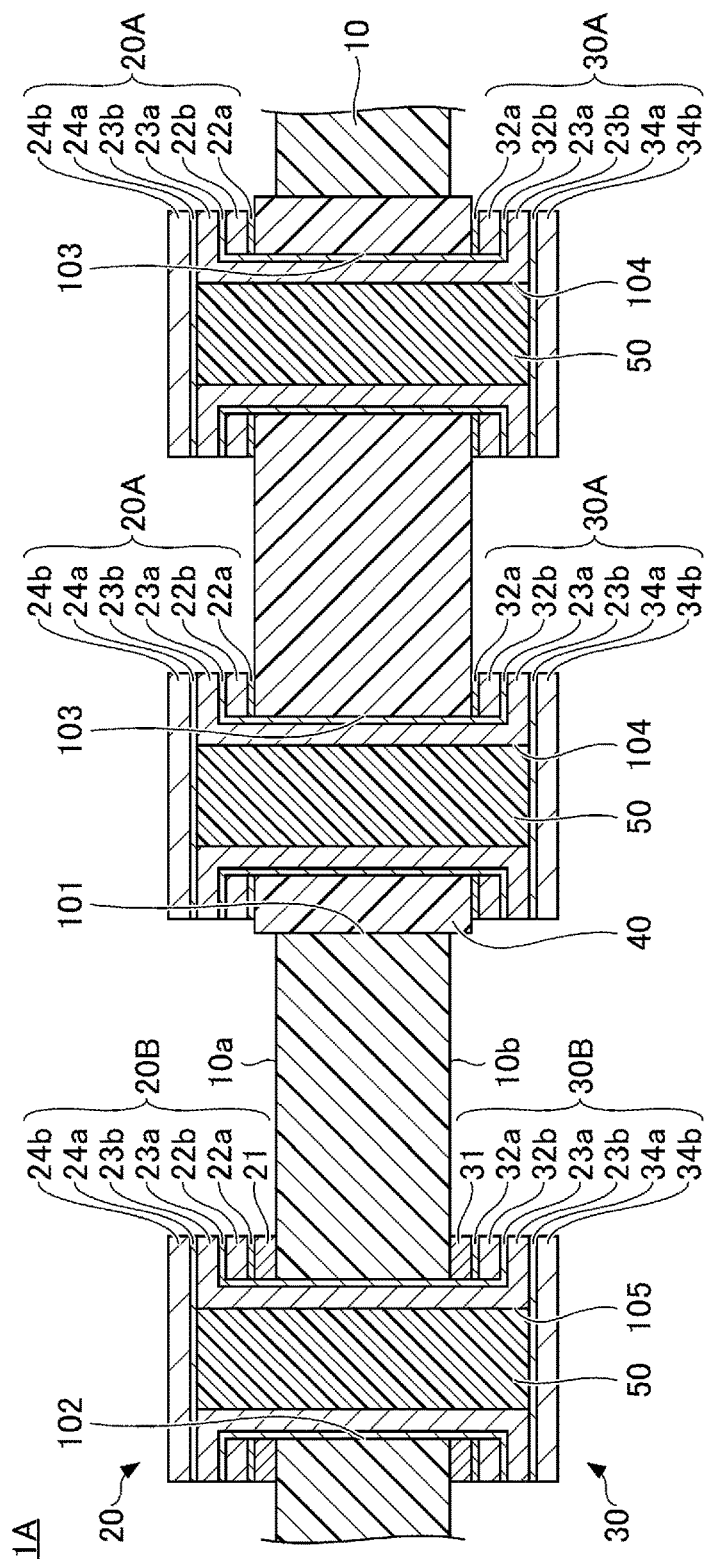
FIG. 9A and FIG. 9B are diagrams illustrating an example of the wiring board according to a first modification of the first embodiment.
Figure 9B:
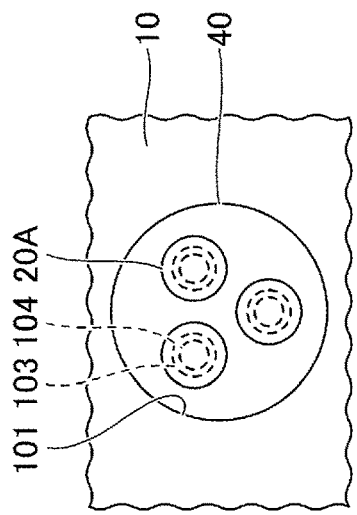

FIG. 9A and FIG. 9B are diagrams illustrating the wiring board according to the first modification of the first embodiment. FIG. 9A is a partial cross sectional view of the wiring board, and FIG. 9B is a partial plan view near the magnetic resin illustrated in FIG. 9A. As illustrated in FIG. 9A and FIG. 9B, a wiring board 1A differs from the wiring board 1 illustrated in FIG. 1, in that three through holes 103, which penetrate the magnetic resin 40, are provided in the magnetic resin 40. However, the number of through holes 103 penetrating the magnetic resin 40 may be two, or four or more.

In the plan view of the wiring board 1A, the three through holes 103 are arranged in point symmetry with respect to the center of magnetic resin 40 which is circular, for example. The interconnect structure inside each through hole 103, and the interconnect structure of the pad 20A, are the same as those of the wiring board 1.

Accordingly, a plurality of through holes 103, which penetrate the magnetic resin 40, may be provided in the magnetic resin 40. In this case, the second electroless plating film 23a makes direct contact with the inner wall surface of each of the through holes 103. As a result, as in the case of the wiring board 1, it is possible to form a highly reliable via interconnect inside each of the through holes 103.

In addition, it is possible to improve the electrical characteristics, such as the inductance, by the increased volume of the magnetic resin 40 and the increased number of via interconnects penetrating the magnetic resin 40.

<Second Modification of First Embodiment>

A second modification of the first embodiment illustrates an example provided with a pad which is formed so as to cover an outer peripheral surface of the magnetic resin protruding from the core layer. In this second modification of the first embodiment, those constituent elements having substantially the same functions or structures are designated by the same reference numerals, and a repeated description of such constituent elements may be omitted.

Figure 10:
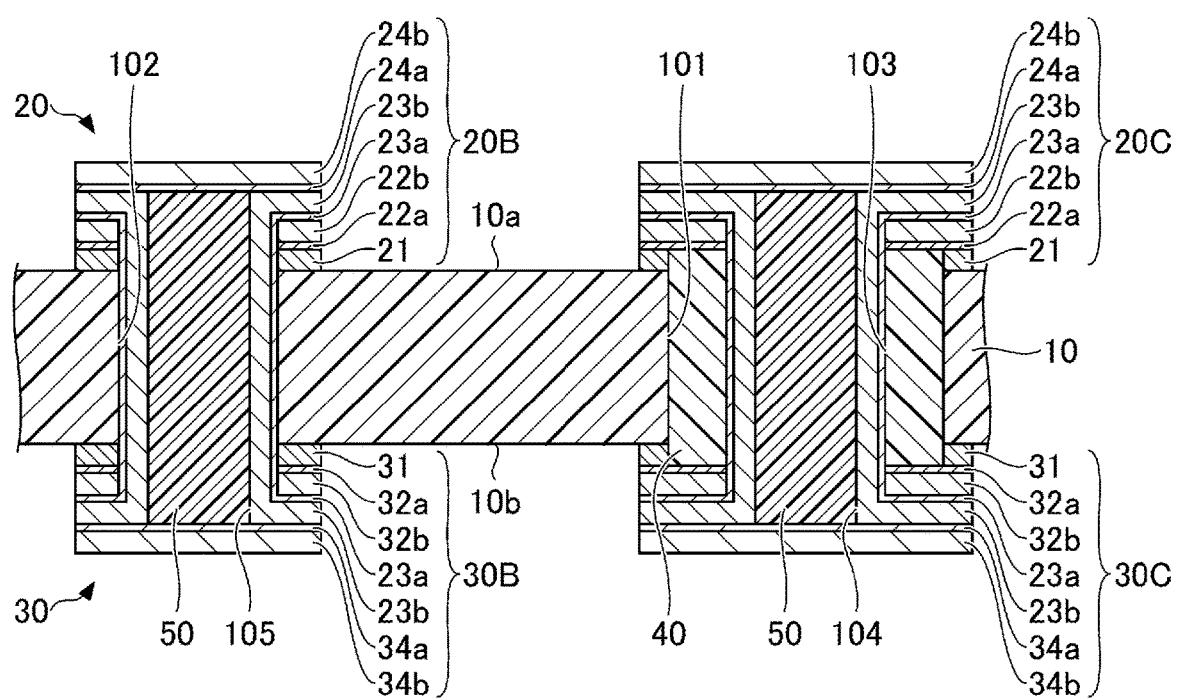
FIG. 10 is a partial cross sectional view illustrating an example of the wiring board according to a second modification of the first embodiment.

FIG. 10 is a partial cross sectional view illustrating the wiring board according to the second modification of the first embodiment. As illustrated in FIG. 10, a wiring board 1B differs from wiring board 1 illustrated in FIG. 1, in that the pads 20A and 30A are replaced with pads 20C and 30C.

The pad 20C differs from the pad 20A, in that the pad 20C includes an annular metal film 21 in contact with the outer peripheral surface of the magnetic resin 40 projecting from the first surface 10a of the core layer 10. The upper surface of the metal film 21 and one end surface of the magnetic resin 40 coincide, for example. The first electroless plating film 22a, the first electrolytic plating film 22b, the second electroless plating film 23a, the second electrolytic plating film 23b, the third electroless plating film 24a, and the third electrolytic plating film 24b extend above the upper surface of the metal film 21.

The pad 30C differs from the pad 30A, in that the pad 30C includes a toroidal metal film 31 in contact with the outer peripheral surface of the magnetic resin 40 projecting from the second surface 10b of the core layer 10. The lower surface of the metal film 31 and the other end surface of the magnetic resin 40 coincide, for example. The first electroless plating film 32a, the first electrolytic plating film 32b, the second electroless plating film 23a, the second electrolytic plating film 23b, the third electroless plating film 34a, and the third electrolytic plating film 34b extend below the lower surface of the metal film 31.

For example, when forming the pads 20C and 30C to have a planar shape that is circular, the etching resist patterns 310 and 320 in the process illustrated in FIG. 7B may have a circular planar shape with a diameter larger than the diameter of the magnetic resin 40, and be formed at positions at least overlapping the magnetic resin 40 in the plan view.

Accordingly, the pads 20C and 30C may be formed to cover the outer peripheral surface of the magnetic resin protruding from the core layer 10. In this case, the second electroless plating film 23a makes direct contact with the inner wall surface of the through hole 103. As a result, as in the case of the wiring board 1, it is possible to form a highly reliable via interconnect inside each of the through holes 103.

The magnetic resin 40 looses magnetic particles when exposed to an alkaline agent, thereby causing a decrease in inductance. However, in the manufacturing method according to this modification, damage to the magnetic resin 40 by the alkaline agent can be prevented, because the magnetic resin 40 is not exposed even after formation of the interconnect patterns.

<Third Modification of First Embodiment>

A third modification of the first embodiment illustrates an example which thins the interconnect layer. In the third modification of the first embodiment, those constituent elements having substantially the same functions or structures are designated by the same reference numerals, and a repeated description of such constituent elements may be omitted.

Figure 11:
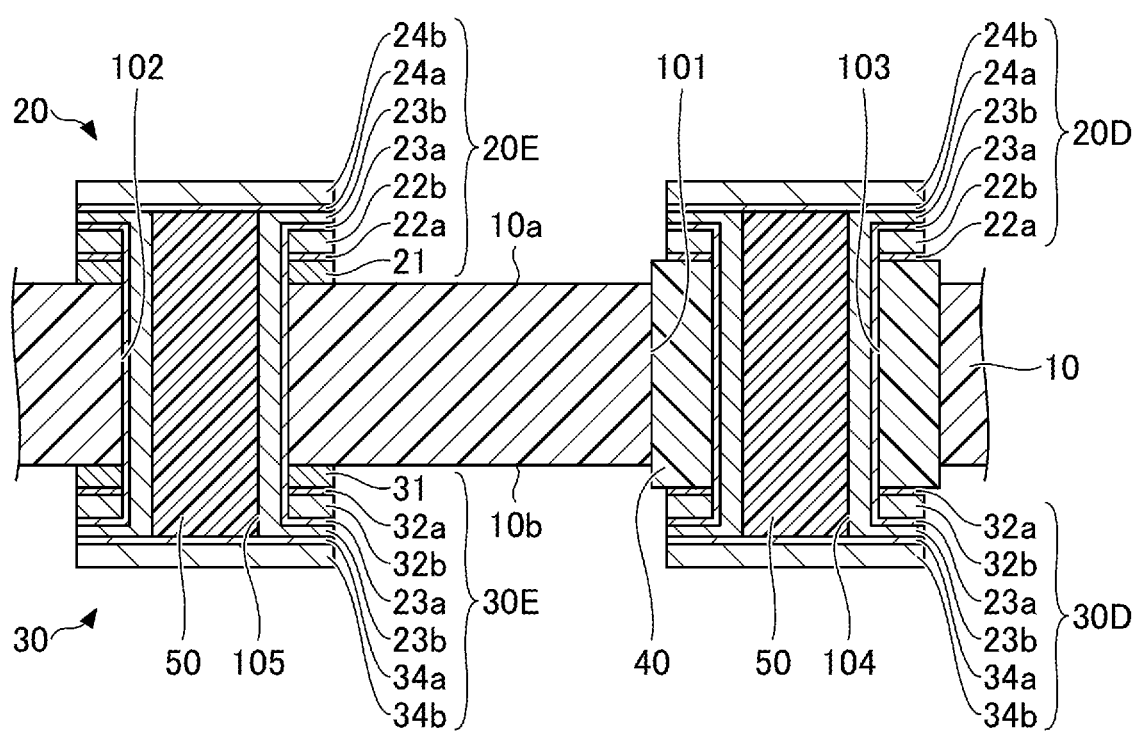
FIG. 11 is a partial cross sectional view illustrating an example of the wiring board according to a third modification of the first embodiment.

FIG. 11 is a partial cross sectional view illustrating the wiring board according to the third modification of the first embodiment. As illustrated in FIG. 11, a wiring board 1C differs from wiring board 1 illustrated in FIG. 1, in that the pads 20A and 30A are replaced with pads 20D and 30D, and the pads 20B and 30B are replaced with pads 20E and 30E.

In the pads 20D and 30D, the thickness of the second electrolytic plating film 23b of the laminated part is smaller than the thickness of the second electrolytic plating film 23b positioned inside the through holes 103. In the pads 20D and 30D, the thickness of the second electrolytic plating film 23b of the laminated part is preferably smaller than the thicknesses of the first electrolytic plating films 22b and 32b, and the thicknesses of the third electrolytic plating films 24b and 34b. In the pads 20D and 30D, the thickness of the second electrolytic plating film 23b positioned inside the through hole 103 is preferably greater than the thicknesses of the first electrolytic plating films 22b and 32b, and the thicknesses of the third electrolytic plating films 24b and 34b.

In addition, in the pads 20E and 30E, the thickness of the second electrolytic plating film 23b of the laminate section is smaller than the thickness of the second electrolytic plating film 23b located inside the through hole 102. In the pads 20E and 30E, the thickness of the second electrolytic plating film 23b of the laminated part is preferably smaller than the thicknesses of the first electrolytic plating films 22b and 32b, and the thicknesses of the third electrolytic plating films 24b and 34b. In the pads 20E and 30E, the thickness of the second electrolytic plating film 23b positioned inside the through hole 102 is preferably greater than the thicknesses of the first electrolytic plating films 22b and 32b, and the thicknesses of the third electrolytic plating films 24b and 34b.

Figure 12:
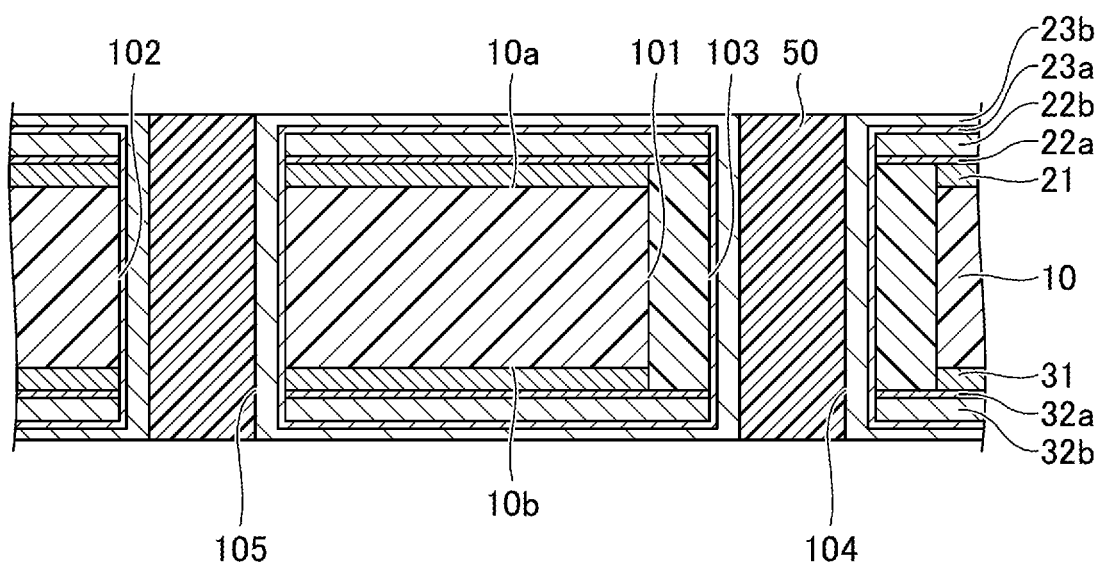
FIG. 12 is a diagram illustrating an example of the manufacturing process of the wiring board according to the third modification of the first embodiment.

In order to form the second electrolytic plating film 23b of the laminated part to a thickness smaller than the thickness of the second electrolytic plating film 23b positioned inside the through hole, the process illustrated in FIG. 12 may be performed in place of the process illustrated in FIG. 6B of the first embodiment.

In the process illustrated in FIG. 12, the insulating resin 50 protruding from the upper surface of the second electrolytic plating film 23b positioned closer to the first surface 10a of the core layer 10, and from the lower surface of the second electrolytic plating film 23b positioned closer to the second surface 10b of the core layer 10, is polished. Then, the upper end surface of the insulating resin 50 coincides with the upper surface of the second electrolytic plating film 23b positioned closer to the first surface 10a of the core layer 10, and polishing continues even after the lower end surface of the insulating resin 50 coincides with the lower surface of the second electrolytic plating film 23b positioned closer to the second surface 10b of the core layer 10.

The polishing ends when the second electrolytic plating film 23b positioned closer to the first surface 10a of the core layer 10, and the second electrolytic plating film 23b positioned closer to the second surface 10b of the core layer 10, reach desired thicknesses. After the polishing, a desmear process is performed, as required, to remove residue of the insulating resin 50 adhered to the upper end surface of the insulating resin 50, the upper surface of the second electrolytic plating film 23b positioned closer to the first surface 10a of the core layer 10, the lower end surface of the insulating resin 50, and the lower surface of the second electrolytic plating film 23b positioned closer to the second surface 10b of the core layer 10.

In the wiring board 1C having the structure described above, the interconnect layers 20 and 30 including pads 20D, 20E, 30D, and 30E can be thinned while securing the thickness of the second electrolytic plating film 23b formed on the inner wall surface of the through hole 103. As a result, a highly reliable via interconnect can be formed in the through hole 103, and the interconnect layers 20 and 30 can be thinned, to reduce the size of the interconnect layers 20 and 30.

<First Application>

A first application illustrates an example of a multilayer wiring board including the wiring board 1. In the first application, those constituent elements having substantially the same functions or structures are designated by the same reference numerals, and a repeated description of such constituent elements may be omitted.

Figure 13:
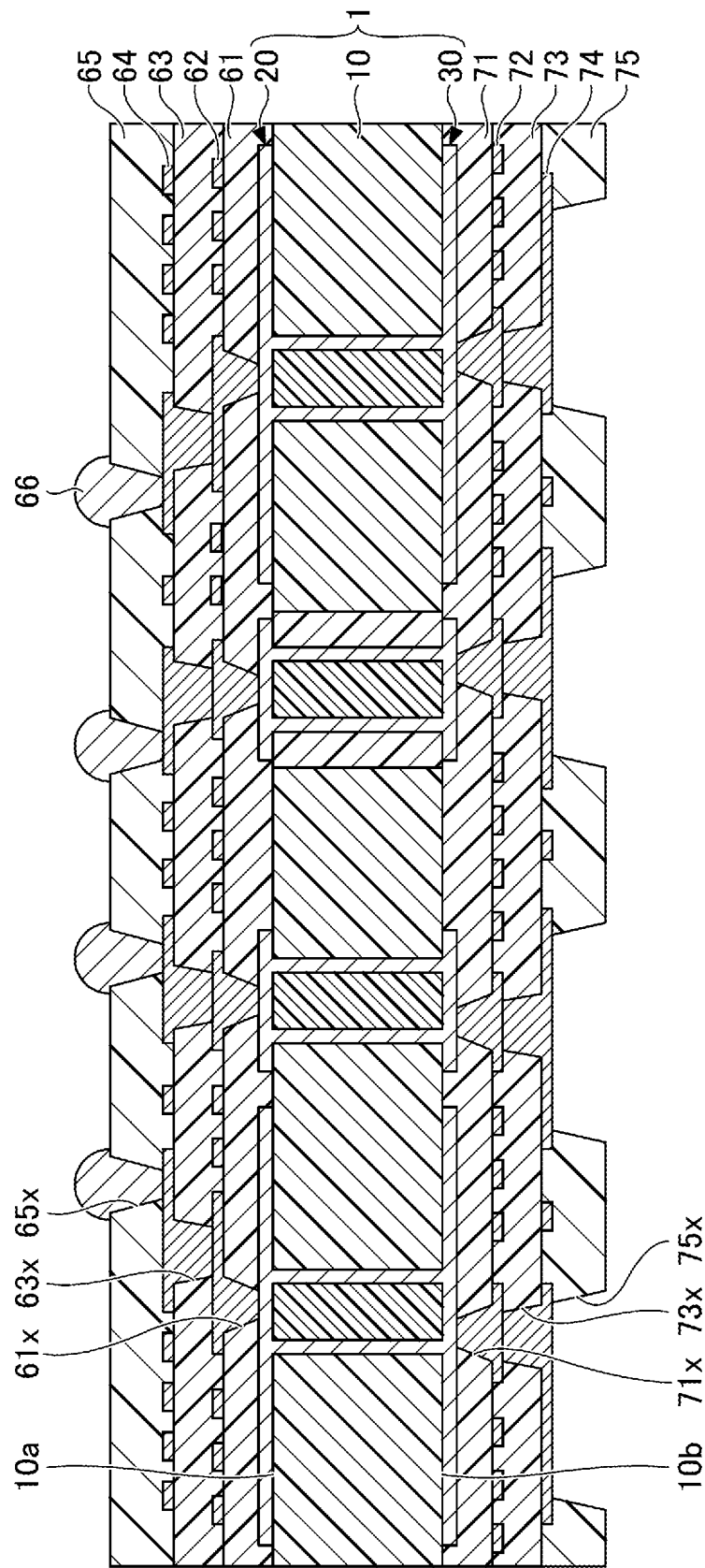
FIG. 13 is a cross sectional view illustrating an example of a multilayer wiring board according to a first application.

FIG. 13 is a cross sectional view illustrating an example of the multilayer wiring board according to the first application. As illustrated in FIG. 13, a multilayer wiring board 2 includes the wiring board 1, an insulating layer 61, an interconnect layer 62, an insulating layer 63, an interconnect layer 64, and a solder resist layer 65 which are successively laminated on the first surface 10a of the core layer 10 of the wiring board 1. The multilayer wiring board 2 further includes an insulating layer 71, an interconnect layer 72, an insulating layer 73, an interconnect layer 74, and a solder resist layer 75 which are successively laminated on the second surface 10b of the core layer 10.

The insulating layer 61 is formed on the first surface 10a of the core layer 10, so as to cover the interconnect layer 20. For example, an insulating resin or the like having an epoxy-based resin or a polyimide-based resin as a main component thereof, may be used as a material forming the insulating layer 61. The insulating layer 61 may have a thickness in a range of approximately 30 μm to approximately 40 μm, for example. The insulating layer 61 may include a filler, such as silica ($SiO_2$) or the like.

The interconnect layer 62 is formed on one surface of the insulating layer 61. The interconnect layer 62 includes a via interconnect filling the inside of a via hole 61x which penetrates the insulating layer 61 and exposes the upper surface of interconnect layer 20, and an interconnect pattern formed on the upper surface of insulating layer 61. The interconnect pattern of interconnect layer 62 is electrically connected to the interconnect layer 20 via the via interconnect. The via hole 61x is a cavity having an inverted truncated cone shape, and a diameter of an opening the cavity at one end which opens to the insulating layer 63 is greater than a diameter of the opening at a bottom surface at the other end formed by the upper surface of the interconnect layer 20. The material used for the interconnect layer 62 may be copper or the like, for example.

The insulating layer 63 is formed on the upper surface of the insulating layer 61, so as to cover the interconnect layer 62. The material and thickness of the insulating layer 63 are similar to those of the insulating layer 61, for example. The insulating layer 63 may include a filler, such as silica ($SiO_2$) or the like.

The interconnect layer 64 is formed on one surface of the insulating layer 63. The interconnect layer 64 includes a via interconnect filling the inside of a via hole 63x which penetrates the insulating layer 63 and exposes the upper surface of interconnect layer 62, and an interconnect pattern formed on the upper surface of insulating layer 63. The interconnect pattern of interconnect layer 64 is electrically connected to the interconnect layer 62 via the via interconnect. The via hole 63x is a cavity having an inverted truncated cone shape, and a diameter of an opening the cavity at one end which opens to the solder resist layer 65 is greater than a diameter of the opening at a bottom surface at the other end formed by the upper surface of the interconnect layer 62. The material used for the interconnect layer 64 may be copper or the like, for example.

The solder resist layer 65 is an outermost layer on one side of the multilayer wiring board 2, and is formed on the upper surface of the insulating layer 63, so as to cover the interconnect layer 64. The solder resist layer 65 may be formed of a photosensitive resin, such as an epoxy-based resin, an acrylic-based resin, or the like. The solder resist layer 65 may have a thickness in a range of approximately 15 μm to approximately 35 μm, for example.

The solder resist layer 65 has an opening 65x, and a portion of the upper surface of interconnect layer 64 is exposed at the bottom of opening 65x. A planar shape of the opening 65x may be circular, for example. A metal layer may be formed on the upper surface of the interconnect layer 64 exposed inside the opening 65x, or an antioxidant process, such as an organic solderability preservative (OSP) process or the like, may be performed, as required. Examples of the metal layer include an Au layer, a Ni/Au layer (a metal layer made up of a Ni layer and a Au layer laminated in this order), a Ni/Pd/Au layer (a metal layer made up of a Ni layer, a Pd layer, and a Au layer laminated in this order), or the like, for example.

An external connection terminal 66 is formed on the upper surface of the interconnect layer 64 exposed at the bottom of the opening 65x. The external connection terminal 66 may be a solder bump, for example. The material used for the solder bump may be an alloy including Pb, an alloy of Sn and Cu, an alloy of Sn and Ag, an alloy of Sn, Ag and Cu, or the like, for example. The external connection terminal 66 is a terminal for making an electrical connection to the semiconductor chip.

The insulating layer 71 is formed on the second surface 10b of the core layer 10, so as to cover the interconnect layer 30. The material and thickness of the insulating layer 71 may be similar to those of the insulating layer 61, for example. The insulating layer 71 may include a filler, such as silica (SiO₂) or the like.

The interconnect layer 72 is formed on the other side of the insulating layer 71. The interconnect layer 72 includes a via interconnect filled inside a via hole 71x which penetrates the insulating layer 71 and exposes the lower surface of the interconnect layer 30, and an interconnect pattern formed on the lower surface of the insulating layer 71. The interconnect pattern of the interconnect layer 72 is electrically connected to the interconnect layer 30 via the via interconnect. The via hole 71x is a cavity having an inverted truncated cone shape, and a diameter of an opening the cavity at one end which opens to the insulating layer 73 is greater than a diameter of the opening at a bottom surface at the other end formed by the lower surface of the interconnect layer 30. The material used for the interconnect layer 72 may be copper or the like, for example.

The insulating layer 73 is formed on the lower surface of the insulating layer 71, so as to cover the interconnect layer 72. The material and thickness of the insulating layer 73 may be similar to those of the insulating layer 61, for example. The insulating layer 73 may include a filler, such as silica (SiO₂) or the like.

The interconnect layer 74 is formed on the other side of the insulating layer 73. The interconnect layer 74 includes a via interconnect filled inside a via hole 73x which penetrates the insulating layer 73 and exposes the lower surface of the interconnect layer 72, and an interconnect pattern formed on the lower surface of the insulating layer 73. The interconnect pattern of the interconnect layer 74 is electrically connected to the interconnect layer 72 via the via interconnect. The via hole 73x is a cavity having an inverted truncated cone shape, and a diameter of an opening the cavity at one end which opens to the solder resist layer 75 is greater than a diameter of the opening at a bottom surface at the other end formed by the lower surface of the interconnect layer 72. The material used for the interconnect layer 74 may be copper or the like, for example.

The solder resist layer 75 is an outermost layer on the other side of the multilayer wiring board 2, and is formed on the lower surface of the insulating layer 73, so as to cover the interconnect layer 74. The material and thickness of the solder resist layer 75 may be similar to those of the solder resist layer 65, for example.

The solder resist layer 75 includes an opening 75x, and a portion of the lower surface of interconnect layer 74 is exposed inside the opening 75x. A planar shape of the opening 75x may be circular, for example. The interconnect layer 74, exposed inside the opening 75x, may be used as a pad for making electrical connection to a mounting substrate (not illustrated), such as a motherboard or the like. A metal layer may be formed on the lower surface of the interconnect layer 74 exposed inside the opening 75x, or an antioxidant process, such as the OSP process, may be performed, if required.

Accordingly, the wiring board 1 according to the first embodiment may be used to manufacture the multilayer wiring board 2. One of the wiring boards 1A, 1B, and 1C may be used in place of the wiring board 1.

<Second Application>

A second application illustrates an example of a semiconductor package including a semiconductor chip, mounted on the multilayer wiring board according to the first application by flip-chip bonding, for example. In the second application, those constituent elements having substantially the same functions or structures are designated by the same reference numerals, and a repeated description of such constituent elements may be omitted.

FIG. 14 is a cross sectional view illustrating an example of the semiconductor package according to the second application. As illustrated in FIG. 14, a semiconductor package 3 includes the multilayer wiring board 2 illustrated in FIG. 13, a semiconductor chip 100, a bump 130, and an underfill resin 140. I In the semiconductor package 3, the solder resist layer 65 of the multilayer wiring board 2 forms a semiconductor chip mounting surface on which the semiconductor chip 100 is mounted, and the solder resist layer 75 of the multilayer wiring board 2 forms an external connecting surface on which the external connecting terminal is formed.

The semiconductor chip 100 may include a semiconductor integrated circuit (not illustrated) or the like formed on a thinned, semiconductor substrate 110 made of silicon or the like, for example. An electrode pad 120 is formed on semiconductor substrate 110, and electrically connects to the semiconductor integrated circuit (not illustrated).

The bump 130 electrically connects the electrode pad 120 of the semiconductor chip 100 to the external connection terminal 66 of the multilayer wiring board 2. The bump 130 may be a solder bump, for example. The material used for the solder bump 130 may be an alloy including Pb, an alloy of Sn and Cu, an alloy of Sn and Ag, an alloy of Sn, Ag and Cu, or the like, for example. The underfill resin 140 is filled between the semiconductor chip 100 and the solder resist layer 65 of the multilayer wiring board 2.

Accordingly, the semiconductor package 3 can be manufactured by mounting the semiconductor chip 100 on the multilayer wiring board 2.

Accordingly to each of the embodiments described above, it is possible to provide a wiring board having a reliable interconnect inside a through hole of a magnetic resin, and a method for manufacturing the wiring boards.

Various aspects of the subject-matter described herein may be set out non-exhaustively in the following numbered clauses:

1. A method for manufacturing a wiring board, comprising:
   forming a first through hole in a core layer;
   filling a magnetic resin in the first through hole;
   forming a second through hole in the magnetic resin; and
   forming a plating film covering an inner wall surface of the second through hole,
   wherein the forming the plating film includes forming an electroless plating film, and forming an electrolytic plating film, and
   wherein the forming the electroless plating film forms the electroless plating film direct contact with an inner wall surface of the second through hole.

2. The method for manufacturing the wiring board according to clause 1, wherein
   the forming the plating film forms a first interconnect layer including a laminated part in which a first electroless plating film, a first electrolytic plating film, a second electroless plating film, a second electrolytic plating film, a third electroless plating film, and a third electrolytic plating film are successively laminated on an end surface of the magnetic resin, and
   the electroless plating film, making direct contact with the inner wall surface of the second through hole, is the second electroless plating film of the laminated part, covering an end surface of the first electrolytic plating film and an end surface of the first electroless plating film, and extending inside the second through hole.

3. The method for manufacturing the wiring board according to clause 2, further comprising:
   making a thickness of the second electrolytic plating film of the laminated part smaller than a thickness of the second electrolytic plating film positioned inside the second through hole,
   wherein the second electrolytic plating film positioned inside the second through hole is the second electrolytic plating film of the laminated part extending inside the second through hole, and
   wherein the second electrolytic plating film is provided inside the second through hole, by covering the second electroless plating film positioned inside the second through hole.

Although the embodiments, modifications, and applications are numbered with, for example, "first," "second," or "third," the ordinal numbers do not imply priorities of the embodiments, modifications, and applications. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A method for manufacturing a wiring board, comprising:
   forming a first through hole in a core layer;
   filling a magnetic resin in the first through hole;
   forming a first plating film on an upper surface of the core layer and on an end surface of the magnetic resin;
   forming a second through hole in the first plating film and the magnetic resin;
   forming a second plating film covering an upper surface and an end surface of the first plating film, and making direct contact with an inner wall surface of the second through hole without making direct contact with the end surface of the magnetic resin; and
   polishing an upper surface of the second plating film until a thickness of the second plating film reaches a desired thickness.

2. The method for manufacturing the wiring board as claimed in claim 1, wherein the polishing includes
   polishing the upper surface of the second plating film on the upper surface of the core layer, until the thickness of the second plating film on the upper surface of the core layer becomes smaller than the thickness of the second plating film inside the second through hole.

3. The method for manufacturing the wiring board as claimed in claim 1, wherein the thickness of the second plating film inside the second through hole is larger than a thickness of the first plating film.

4. The method for manufacturing the wiring board as claimed in claim 1, further comprising:
   forming a third through hole on an inner side of the second plating film inside the second through hole; and
   filling an insulating resin in the third through hole,
   wherein the polishing includes
     polishing an end surface of the insulating resin together with the upper surface of the second plating film, until the upper surface of the second plating film coincides with the end surface of the insulating resin.

5. The method for manufacturing the wiring board as claimed in claim 4, further comprising:
   forming a third plating film covering the upper surface of the second plating film and the end surface of the insulating resin.

6. The method for manufacturing the wiring board as claimed in claim 5, wherein the thickness of the second plating film inside the second through hole is larger than a thickness of the third plating film.

7. The method for manufacturing the wiring board as claimed in claim 5, further comprising:
   forming a first interconnect layer on the end surface of the magnetic resin,
   wherein the first interconnect layer includes the first plating film, the second plating film, and the third plating film that are successively laminated.

8. The method for manufacturing the wiring board as claimed in claim 7, further comprising:
   forming an insulating layer on the core layer, so as to cover the first interconnect layer;
   forming a via hole in the insulating layer, so as to expose the first interconnect layer inside the via hole; and
   forming a second interconnect layer on the insulating layer and a via interconnect inside the via hole, so as to electrically connect the first interconnect layer and the second interconnect layer through the via interconnect.

9. The method for manufacturing the wiring board as claimed in claim 1, wherein the forming the first plating film includes
   successively forming a first electroless plating film, and a first electrolytic plating film.

10. The method for manufacturing the wiring board as claimed in claim 1, wherein the forming the second plating film includes
   successively forming a second electroless plating film, and a second electrolytic plating film, so that inside the second through hole, the second electroless plating film makes direct contact with the inner wall surface of the second through hole.

11. The method for manufacturing the wiring board as claimed in claim 5, wherein the forming the third plating film includes
   successively forming a third electroless plating film, and a third electrolytic plating film.

12. The method for manufacturing the wiring board as claimed in claim 1, wherein
   a metal film is formed on the core layer, and
   the forming the first through hole forms the first through hole penetrating the metal film and the core layer.

13. The method for manufacturing the wiring board as claimed in claim 12, wherein the filling the magnetic resin in the first through hole includes
   polishing an upper surface of the metal film and the end surface of the magnetic resin, so that the upper surface of the metal film coincides with the end surface of the magnetic resin.

14. The method for manufacturing the wiring board as claimed in claim 1, wherein the forming the second through hole forms the second through hole at a plurality of positions in a plan view of the wiring board.

15. A method for manufacturing a wiring board, comprising:
   forming a first through hole in a core layer;
   filling a magnetic resin in the first through hole;
   forming a first plating film on an upper surface of the core layer and on an end surface of the magnetic resin;
   forming a second through hole in the first plating film and the magnetic resin;
   forming a second plating film covering an upper surface and an end surface of the first plating film, and an inner wall surface of the second through hole; and
   polishing an upper surface of the second plating film until a thickness of the second plating film reaches a desired thickness,
   wherein the thickness of the second plating film inside the second through hole is larger than a thickness of the first plating film.

16. A method for manufacturing a wiring board, comprising:
   forming a first through hole in a core layer;
   filling a magnetic resin in the first through hole;
   forming a first plating film on an upper surface of the core layer and on an end surface of the magnetic resin;
   forming a second through hole in the first plating film and the magnetic resin;
   forming a second plating film covering an upper surface and an end surface of the first plating film, and an inner wall surface of the second through hole;
   forming a third through hole on an inner side of the second plating film inside the second through hole;
   filling an insulating resin in the third through hole; and
   polishing an upper surface of the second plating film until a thickness of the second plating film reaches a desired thickness,
   wherein the polishing includes
      polishing an end surface of the insulating resin together with the upper surface of the second plating film, until the upper surface of the second plating film coincides with the end surface of the insulating resin.

17. The method for manufacturing the wiring board as claimed in claim 16, further comprising:
   forming a third plating film covering the upper surface of the second plating film and the end surface of the insulating resin.

18. The method for manufacturing the wiring board as claimed in claim 17, wherein the thickness of the second plating film inside the second through hole is larger than a thickness of the third plating film.

19. The method for manufacturing the wiring board as claimed in claim 18, further comprising:
   forming a first interconnect layer on the end surface of the magnetic resin,
   wherein the first interconnect layer includes the first plating film, the second plating film, and the third plating film that are successively laminated.

20. The method for manufacturing the wiring board as claimed in claim 19, further comprising:
   forming an insulating layer on the core layer, so as to cover the first interconnect layer;
   forming a via hole in the insulating layer, so as to expose the first interconnect layer inside the via hole; and
   forming a second interconnect layer on the insulating layer and a via interconnect inside the via hole, so as to electrically connect the first interconnect layer and the second interconnect layer through the via interconnect.

21. A method for manufacturing a wiring board, comprising:
   forming a first through hole in a core layer having a metal film formed thereon so that the first through hole penetrates the metal film and the core layer;
   filling a magnetic resin in the first through hole;
   forming a first plating film on an upper surface of the core layer and on an end surface of the magnetic resin;
   forming a second through hole in the first plating film and the magnetic resin;
   forming a second plating film covering an upper surface and an end surface of the first plating film, and an inner wall surface of the second through hole; and
   polishing an upper surface of the second plating film until a thickness of the second plating film reaches a desired thickness,
   wherein the filling the magnetic resin in the first through hole includes
      polishing an upper surface of the metal film and the end surface of the magnetic resin, so that the upper surface of the metal film coincides with the end surface of the magnetic resin.

* * * * *